US008131006B2

(12) United States Patent
Martin

(10) Patent No.: US 8,131,006 B2
(45) Date of Patent: Mar. 6, 2012

(54) MEMS DEVICE WITH SURFACE HAVING A LOW ROUGHNESS EXPONENT

(75) Inventor: John R. Martin, Foxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 1035 days.

(21) Appl. No.: 12/026,844

(22) Filed: Feb. 6, 2008

(65) Prior Publication Data

US 2008/0187154 A1 Aug. 7, 2008

Related U.S. Application Data

(60) Provisional application No. 60/888,417, filed on Feb. 6, 2007.

(51) Int. Cl.
*H04R 11/02* (2006.01)
*H01L 21/00* (2006.01)

(52) U.S. Cl. .......................................... 381/423; 438/53

(58) Field of Classification Search .................. 381/337, 381/417, 423, 424; 438/52, 53; 257/415–419, 257/E29.324, E21.613

See application file for complete search history.

(56) References Cited

U.S. PATENT DOCUMENTS

| | | | | |
|---|---|---|---|---|
| 5,510,156 | A | 4/1996 | Zhao | 427/534 |
| 5,679,436 | A | 10/1997 | Zhao | 428/141 |
| 5,939,633 | A | 8/1999 | Judy | 73/514.32 |
| 6,505,511 | B1 | 1/2003 | Geen et al. | 73/504.12 |
| 6,674,140 | B2 | 1/2004 | Martin | 257/415 |
| 6,859,577 | B2 * | 2/2005 | Lin | 385/18 |
| 7,220,614 | B2 | 5/2007 | Martin | 438/57 |
| 7,527,742 | B2 * | 5/2009 | Tysoe et al. | 216/83 |
| 2007/0196945 | A1 | 8/2007 | Martin | 438/48 |

OTHER PUBLICATIONS

E. Bhattacharya et al., "*Effect of porous silicon formation on stiction in surface micromachined MEMS structures*," Phys. Stat. Sol. (a) 202, No. 8/www.pss-a.com, pp. 1482-1486, 2005.

F. Delrio et al., "*The role of van der Waals forces in adhesion of micromachined surfaces*," Nature Materials, vol. 4, pp. 629-634, Jul. 2005.

D.-L. Liu, et al., *Optimal roughness for minimal adhesion*; American Institute of Physics; Applied Physics Letters vol. 91; paper #043107; 2007.

T.S. Chow, *Nanoadhesion between Rough Surfaces*, Physical Review Letters, vol. 86, pp. 4592-4595; May 14, 2001.

Martin, et al., *Application for United States Patent for MEMS Device with Roughened Surface and Method of Producing the Same*, U.S. Appl. No. 11/538,281, 26 pages, Oct. 3, 2006.

* cited by examiner

*Primary Examiner* — Calvin Lee

(74) *Attorney, Agent, or Firm* — Sunstein Kann Murphy & Timbers LLP

(57) ABSTRACT

A MEMS microphone has a backplate and a movable diaphragm that together form a variable capacitance. The backplate has a backplate surface and, in a corresponding manner, the diaphragm has a diaphragm surface that faces the backplate surface. At least one of the backplate surface and the diaphragm surface has at least a portion with a Hurst exponent that is less than or equal to about 0.5.

22 Claims, 3 Drawing Sheets

MEMS DEVICE WITH SURFACE HAVING A LOW ROUGHNESS EXPONENT

PRIORITY

This patent application claims priority from provisional U.S. patent application No. 60/888,417, filed Feb. 6, 2007, entitled, "OPEN PACKAGE DEVICE WITH ROUGHENED SURFACE," and naming John R. Martin as inventor, the disclosure of which is incorporated herein, in its entirety, by reference.

RELATED APPLICATION

This patent application is related to U.S. patent application Ser. No. 11/538,281, filed Oct. 3, 2006, entitled, "MEMS DEVICE WITH ROUGHENED SURFACE AND METHOD OF PRODUCING THE SAME," and naming Martin, Nunan, Chen, Kuang, and Zhang as inventors, the disclosure of which is incorporated herein, in its entirety, by reference.

This patent application also is related to U.S. Pat. No. 6,674,140, filed Jan. 29, 2001, U.S. Pat. No. 7,220,614, filed Jun. 9, 2003, both entitled, and U.S. application Ser. No. 11/786,515, all entitled "PROCESS FOR WAFER LEVEL TREATMENT TO REDUCE STICTION AND PASSIVATE MICROMACHINED SURFACES AND COMPOUNDS USED THEREFOR," and naming John R. Martin as inventor, the disclosures of which are incorporated herein, in their entireties, by reference.

FIELD OF THE INVENTION

The invention generally relates to MEMS devices and, more particularly, the invention relates to minimizing stiction for MEMS devices.

BACKGROUND OF THE INVENTION

Microelectromechanical systems ("MEMS") are used in a growing number of applications. For example, MEMS currently are implemented as microphones for converting an acoustic signal into an electrical signal. To that end, MEMS microphones often have a movable diaphragm suspended from a stationary backplate to form a variable capacitor. The capacitance of this variable capacitor changes as a function of incident acoustic signals. To receive acoustic signals, a microphone generally has a port in its package. This port consequently exposes the interior components to the outside environment.

The suspended diaphragm and stationary backplate may have very smooth outer surfaces. Consequently, when exposed to humidity, their surfaces may stick together. This phenomenon is known in the art as "stiction," which is a significant cause of yield loss and reliability failures in a wide variety of MEMS products.

SUMMARY OF THE INVENTION

In accordance with one embodiment of the invention, a MEMS microphone has a backplate and a movable diaphragm that together form a variable capacitance. The backplate has a backplate surface and, in a corresponding manner, the diaphragm has a diaphragm surface that faces the backplate surface. At least one of the backplate surface and the diaphragm surface has at least a portion with a Hurst exponent that is less than or equal to about 0.5.

The entire surface of at least one of the backplate surface and diaphragm surface may have a Hurst exponent that is less than or equal to about 0.5. As another example, each of the backplate surface and the diaphragm surface may have at least a portion with a Hurst exponent that is less than or equal to about 0.5. Moreover, the Hurst exponent may be substantially uniform across at least one of the backplate surface and diaphragm surface.

To further improve performance, at least one of the backplate surface and diaphragm surface may have a root mean squared (RMS) roughness that is greater than about 1 nanometer. Some embodiments also may form an organic coating on at least one of the backplate surface and diaphragm surface to reduce surface energy. Among other things, the organic coating may be based on one of a fluorocarbon and hydrocarbon.

In accordance with another embodiment of the invention, a MEMS device has a first surface, and a second surface adjacent to and spaced from the first surface. The first surface is movable relative to the second surface, while at least a portion of the first surface is capable of contacting at least a portion of the second surface. At least one of the first and second surfaces has at least a portion with a Hurst exponent that is less than or equal to about 0.5.

In accordance with other embodiments of the invention, a method provides a MEMS microphone with a backplate and a movable diaphragm that together form a variable capacitance. The backplate has a backplate surface, and the diaphragm has a corresponding diaphragm surface spaced from the backplate surface. At least one of the backplate surface and the diaphragm surface has a Hurst exponent of less than or equal to about 0.5. The method produces an audible signal that causes the diaphragm to move relative to the backplate, and forms a water based droplet between the diaphragm surface and the backplate surface.

When at rest, the diaphragm is spaced a given distance from the backplate. The droplet has a longitudinal dimension (i.e., extending between the diaphragm and backplate) that is greater than half the given distance.

The method also may urge the diaphragm toward the droplet so that the droplet contacts both the diaphragm and the backplate. Despite this contact, the droplet remains intact (i.e., the droplet does not wet onto either of the surfaces). The method then moves the diaphragm away from the droplet after contacting the droplet, eventually moving to the rest position. In illustrative embodiments, MEMS microphone is in a vacuum free environment when performing this method.

Since the diaphragm moves in response to an acoustic signal, the diaphragm/backplating spacing changes dynamically. In normal operation, a plurality of water based droplets may form between the diaphragm surface and the backplate surface. If one or more droplets simultaneously contacts the diaphragm and the backplate, this dynamic motion is affected and device performance is degraded. This result occurs because the surface tension of droplets that bridge the gap between the diaphragm and the backplate imposes a force that alters the spacing. As the amount of wetting of the droplet onto the diaphragm and/or the backplate increases, droplet surface tension pulls the diaphragm closer to the backplate, ultimately causing stiction. Various embodiments reduce wetting of the plurality of droplets onto the diaphragm and backplate and mitigates their effect on device performance. It creates surface-droplet interface conditions that cause the plurality of droplets to de-wet after contact. Thus, the diaphragm can return to the rest position and respond to the acoustic signal without being impeded by the droplets.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments of the invention reduce stiction problems in open package MEMS devices, such as microphones and pressures sensors. To that end, one or both of the opposing surfaces of the diaphragm and backplate have a plurality of surface features, such as peaks, ridges, valleys, and cavities, that minimize the wetting ability of a water droplet. These surface features effectively follow principles similar to those of the so-called "lotus flower effect."

Specifically, various embodiments process the facing surfaces of one or both of the diaphragm and backplate to have a Hurst exponent (also known as the "roughness exponent") that is less than or equal to about 0.5. Details of illustrative embodiments are discussed below.

Figure 1A:
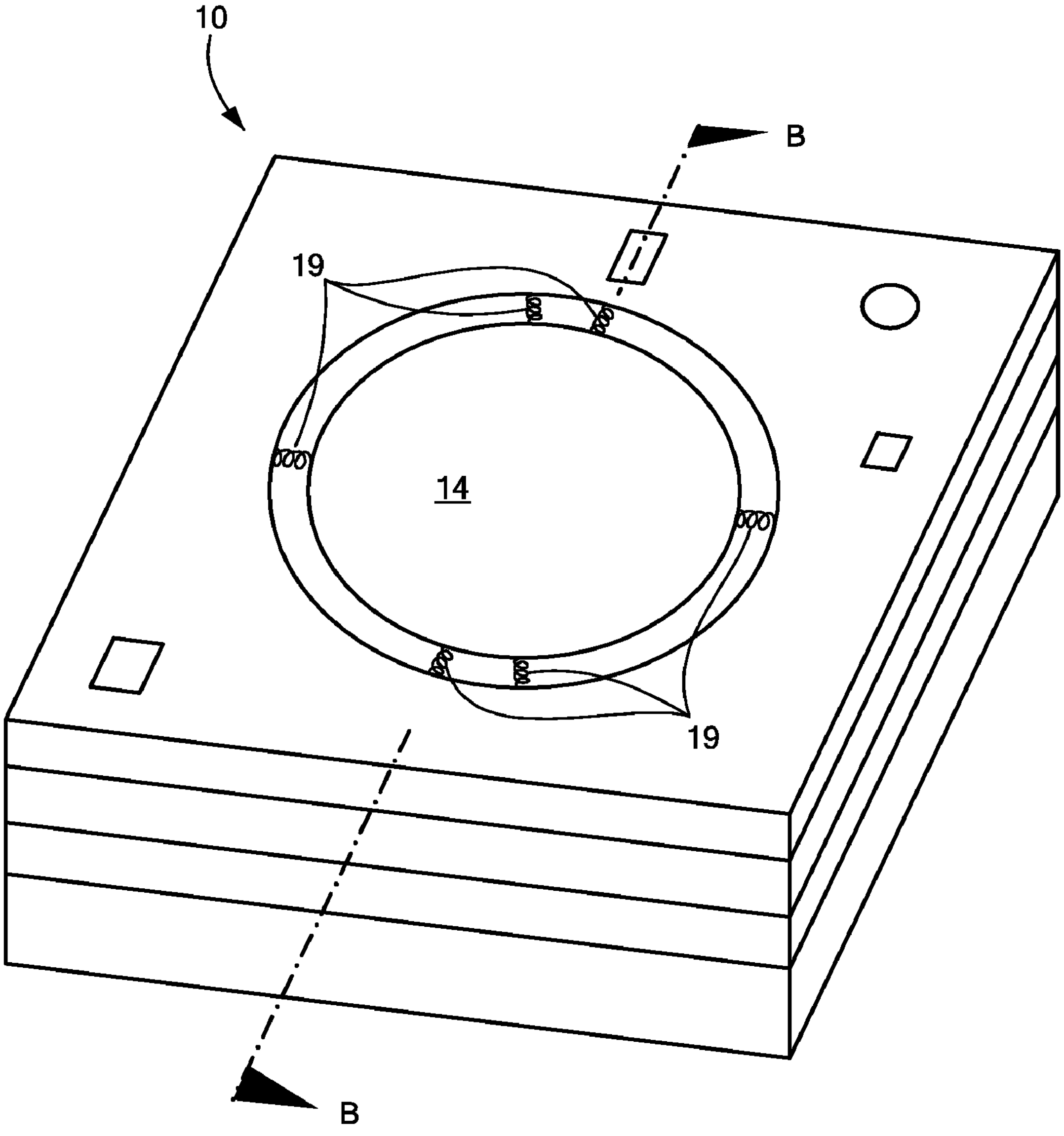
FIG. 1A schematically shows a top, perspective view of a microphone that may be fabricated in accordance with illustrative embodiments of the invention.
Figure 1B:
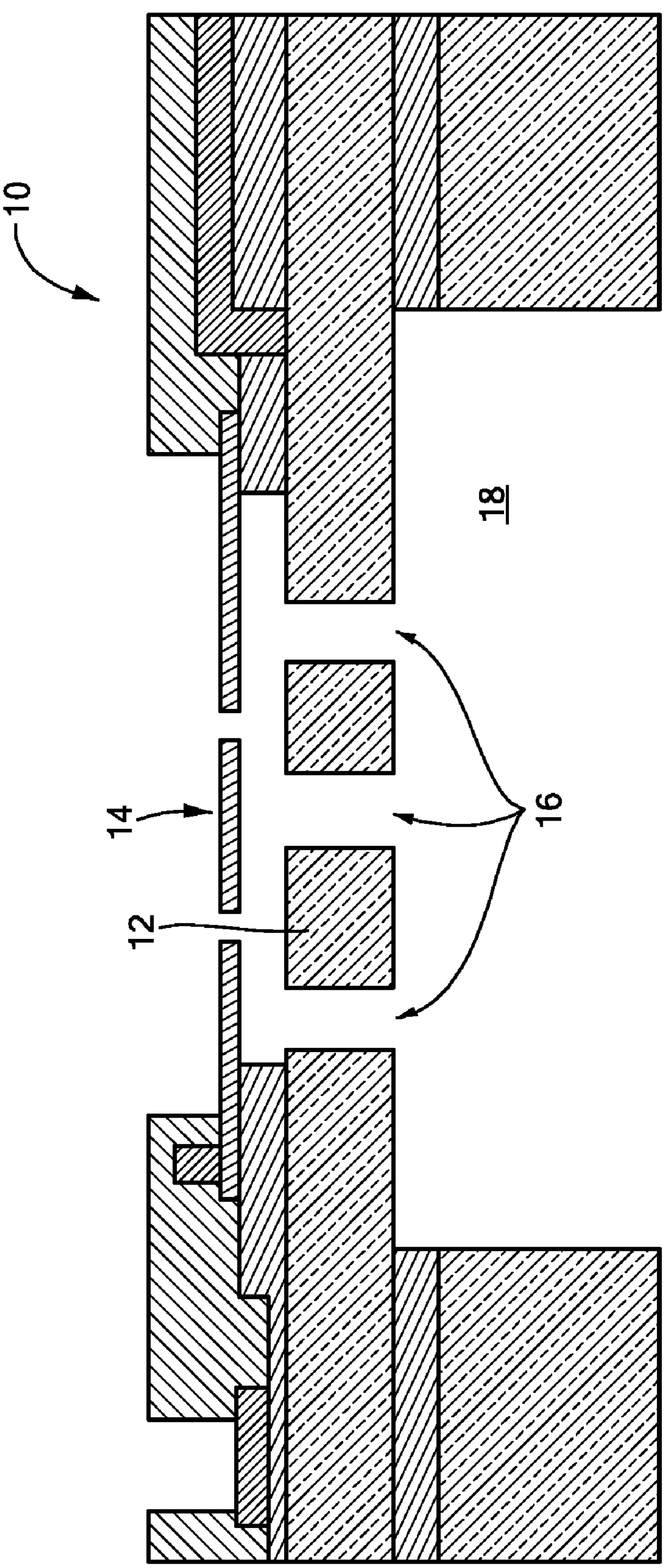
FIG. 1B schematically shows a cross-section of the same microphone across line B-B of FIG. 1A.

FIG. 1A schematically shows a top, perspective view of a microphone 10 (also referred to as a "microphone chip 10") that may be fabricated in accordance with illustrative embodiments of the invention. This microphone 10 is an example of an open package device that could benefit from various embodiments of the invention. FIG. 1B schematically shows a cross-section of the same microphone 10 across line B-B of FIG. 1A.

Among other things, the microphone 10 includes a static backplate 12 that supports and forms a variable capacitor with a flexible diaphragm 14. When at rest, the diaphragm 14 is spaced a given distance from the backplate 12. Receipt of an incident audible/audio signal, however, causes the diaphragm 14 to move, thus varying the capacitance of the capacitor. In illustrative embodiments, the backplate 12 is formed from single crystal silicon (e.g., the top layer of a silicon-on-insulator wafer), while the diaphragm 14 is formed from deposited polysilicon. Other embodiments, however, use other types of materials to form the backplate 12 and the diaphragm 14. For example, a single crystal silicon bulk wafer, or some deposited material may form the backplate 12. In a similar manner, a single crystal silicon bulk wafer, part of an silicon-on-insulator wafer, or some other deposited material may form the diaphragm 14. To facilitate operation, the backplate 12 has a plurality of through-holes 16 that lead to a backside cavity 18.

Springs 19 movably connect the diaphragm 14 to the static portion of the microphone 10, which includes the backplate 12. Among other factors, the springs 19 are configured to provide a return force to the diaphragm 14 that sufficiently returns the diaphragm 14 to its rest position when not subjected to audio signals. Audio signals cause the diaphragm 14 to vibrate, thus producing a changing capacitance. On-chip or off-chip circuitry (not shown) receive (via contacts) and convert this changing capacitance into electrical signals that can be further processed. It should be noted that discussion of the specific microphone 10 shown in FIGS. 1A and 1B is for illustrative purposes only. Other microphone configurations thus may be used.

In accordance with illustrative embodiments of the invention, the bottom surface of the diaphragm 14, the top surface of the backplate 12, or both facing surfaces have a plurality of surface features 20 (e.g., peaks, ridges, valleys, and cavities) that improve hydrophobicity and thus, mitigate stiction problems. Specifically, the cavities 20 are formed to ensure that a water droplet 22 (FIG. 2, discussed below), sized on the order of the given distance between the diaphragm 14 and backplate 12, either coalesces with an adjacent water droplet 22 or vaporizes before wetting into the plurality of cavities 20.

To that end, the cavities 20 are sized and shaped so that the surface tension of such a droplet 22 acts with forces from trapped air and surface topology to oppose wetting energy. This should ensure that the droplet 22 does not spread appreciably. It should be noted that discussion of cavities is for illustration only—to assist in understanding FIG. 2. The surface features described herein may be comprised of various combinations of peaks, ridges, valleys and cavities that act as a total system. Other configurations therefore may be used.

Figure 2:
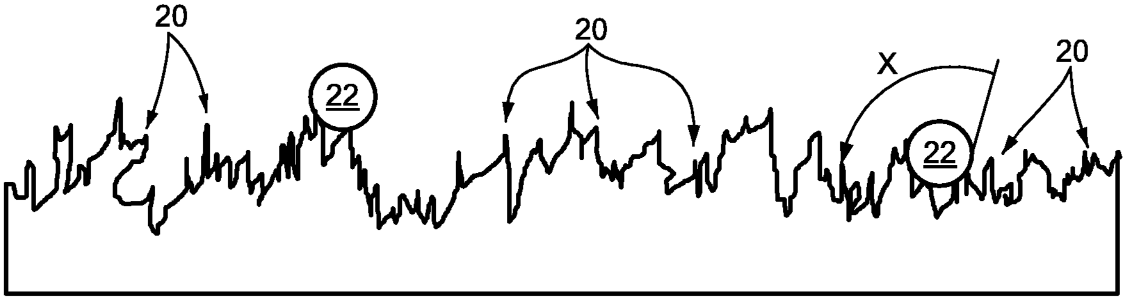
FIG. 2 schematically shows a cross-sectional view of a water droplet on a surface having peaks, ridges, valleys, and cavities.

FIG. 2 schematically shows one example of a diaphragm or backplate surface configured in accordance with illustrative embodiments of the invention. Among other qualities, the cavities 20 may be formed to have relatively steep walls and dimensions that are smaller than the size of a water droplet 22 having an outer dimension on the order of the distance between the diaphragm 14 and backplate 12. For example, the cavity diameters may be less than the cavity depths. In fact, the topology of the given surface (i.e., the diaphragm or backplate surface) even may include retrograde angles. FIG. 2 also schematically shows a cross-sectional view of water droplets 22 on a surface having such a two-dimensional array of cavities 20.

As known by those in the art, wetting ability (i.e., hydrophobicity) of a water droplet 22 is defined by the contact angle X (see FIG. 2) between a water droplet 22 and a surface. This angle X is determined by the interfacial tension Y between three phases: water, vapor (room air in this application to MEMS microphones) and the surface, and comply with the following relationship:

$$Ysv - Yws = Ywv \cos X$$

where:

Ysv=surface/vapor interfacial tension

Yws=water/surface interfacial tension

Ywv=water/vapor interfacial tension

Low values of angle X, often under 30 degrees, characterize hydrophilic surfaces (water drops wet and spread on these surfaces). High values of angle X, however, characterize hydrophobic surfaces (i.e., water droplets 22 approach a spherical shape with minimal wetting). For example, in some applications, the angle X can be above 90 degrees, and even approach 180 degrees. It should be noted that in the provisional patent application to which this application claims priority, this angle X inadvertently was identified as the complimentary angle. See FIG. 2 of this document for the correct angle X.

Since the value of angle X is determined by the balance of these interfacial forces, the roughness of the surface can affect the contact angle. For the purpose of this discussion, when certain aspect ratios of the cavities 20 is sufficiently high, the likelihood of water droplet wetting is reduced. Those aspect ratios include the depth of the cavities 20 to the cavity width, or the height of the cavity peaks compared to the peak-to-peak repeat cavity distance. For example, in contrast to a generally smooth surface, the balance of interfacial forces of the surface shown in FIG. 2 should result in reduced wetting and a higher contact angle.

The contact angle X is anticipated to increase due to trapping of air on the surfaces and in the valleys and cavities 20 (among other things). It thus is important to form a surface that has good gas-trapping topography. Furthermore, many inorganic surfaces exhibit stiction and are readily wet by water based liquids due to their high surface energy and hydrogen bonding capability. Therefore, if the backplate 12, diaphragm 14, or both are a high surface energy material, illustrative embodiments use a surface that combines gas-trapping topography with a low surface energy treatment (discussed below).

The cavities 20 thus are formed so that a water droplet 22 either coalesces with an adjacent water droplet 22 or vaporizes before wetting into any of the plurality of cavities 20. This is believed to occur because the cavities 20 enable a droplet surface tension that acts with forces from trapped air and surface topology to oppose wetting energy, thus preventing the droplet 22 from wetting the surface.

Inorganic surfaces with an RMS roughness (discussed below) more than one or two nanometers are less prone to stiction than smoother surfaces (see for example, "Optimal roughness for minimal adhesion", D.-L. Liu, J. Martin and N. A. Burnham, Applied Physics Letters, 91(4), 043107, 2007). Roughness is normally characterized by a metric, RMS, which averages the surface irregularities. Test results that relate stiction to roughness typically produce considerable scatter and thus, a more complete characterization, beyond simple averages, is important to define the type of surface irregularities that minimize stiction.

One theoretical model predicts that stiction forces may increase by more than an order of magnitude at low values of the Hurst exponent (e.g., see T. S. Chow, Physics Review Letters, 86, 4592, 2001). As known by those in the art, the Hurst exponent, H, quantifies local surface undulations on a scale of zero to one. A surface with a value of H near one is locally smoother than comparable low H surfaces. Actual Hearst exponent readings/tests on a variety of surfaces typically produce values of H in the range of 0.6 to 0.8. This means that normal surfaces are best described as anisotropic or self-affine fractals that look different when viewed at different scales (surface models based on height fluctuations that are uncorrelated Gaussian have a Hurst exponent of 0.5).

To the knowledge of the inventor, experimental correlations between H and stiction are not yet available. However, if the above noted Chow model is correct, high values of H are required to reduce stiction. Thus, those skilled in the art teach away from use of surfaces with low values of H (i.e., those with H less than or equal to about 0.5, such as H values of between about 0.1 and 0.45, or between about 0.2 and 0.5). Contrary to this conventional wisdom, the inventor has discovered a contrary phenomenon—namely, surfaces with low Hurst exponents minimize stiction between adjacent surfaces. This is particularly true for inorganic surfaces treated with a low surface energy anti-stiction coating.

Accordingly, when in the presence of moisture, surfaces with low Hurst exponents mitigate stiction with adjacent surfaces. As noted above, the inventor believes that air and gases within the cavities provides this beneficial effect.

The facing surfaces of both the diaphragm 14 and backplate 12 preferably have a substantially uniform Hurst exponent. Alternative embodiments, however, may not require such an arrangement. For example, some embodiments may configure one or both of the facing surfaces merely to have Hurst exponents less than or equal to about 0.5—without the requirement of substantial uniformity. Other embodiments merely form only one of the facing surfaces in the described manner. Still other embodiments permit some portions of one or both of the facing surfaces to have Hurst exponents that are greater than about 0.5. In such case, at least a portion of the facing surface in question has a Hurst exponent that is less than or equal to about 0.5. It nevertheless is anticipated that various embodiments form the facing surfaces so that their anticipated points of contact have a Hurst exponent that is less than or equal to about 0.5.

To improve performance, some embodiments also add an anti-stiction coating to one or both of the two opposing surfaces. In illustrative embodiments, such a configuration may be partially or totally based on fluorocarbons, hydrocarbons, or related species. Such a coating should reduce surface energy effects, thus further reducing the likelihood that water droplets 22 will wet onto the surface. For example, among other things, fabrication processes may use conventional SAM (self aligned molecules) treatments to form a such an anti-stiction coating. Generally speaking, as known by those skilled in the art, SAM processes deposit a one molecule thick organic layer on an inorganic surface, such as a silicon surface. Also see U.S. Pat. No. 6,674,140, the disclosure of which is incorporated herein, in its entirety, by reference, for additional information regarding anti-stiction coatings. In a manner similar to the Hurst exponent, such a coating may be on one of the facing surfaces, both of the facing surfaces, or selected portions of one or both of the facing surfaces.

It is anticipated that the roughened surface(s)/cavities 20 can be formed by any number of conventional processes. Among others, the surface(s) can be formed by conventional etching or deposition processes. As another example, carbon nanotube mats, nanowires, nanoparticles, or other films may be deposited in a specified manner to produce the desired surface. The surface may be processed to have the desired roughness before or after the optional anti-stiction layer is applied.

Illustrative embodiments may form the surface to have a root mean squared roughness (hereinafter "RMS," as noted above) value of greater than about 1 nanometer. More specifically, as known by those in the art, characterization of surface topography is challenging because most surfaces have a distribution of asperities, ridges, pits and valleys, all of which may have variable shapes and dimensions. For this reason, the surface irregularities that form the surface texture may generally characterized by some type of average. One common representation of surface roughness, RMS, averages the height deviation of N observed asperities Zi, from the mean, Z-bar:

$$\text{RMS} = \left[ \sum_{i=1}^{N} (Z_i - Z\text{-bar})^2 / (N-1) \right]^{0.5}$$

Since RMS is an averaged value, surfaces that have different irregularities may have the same RMS. Furthermore, RMS, is scale dependent, which means that an RMS value based on a profilometer measurement, for example, will differ from one measured with an AFM (atomic force microscope) that is capable of sensing surface fluctuations at the angstrom level. Unless otherwise stated, atomic force microscopy is the technique used for characterizing surface topography in the discussed embodiments of this invention.

Standard roughness metrics like RMS are useful. However, as noted above, they generally do not fully characterize the surface features that affect stiction and wetting properties. Accordingly, illustrative embodiments involve a class of surface which, at certain particular RMS values (e.g., greater than about 1 nanometer), exhibit reduced sticking and wetting.

Figure 3:
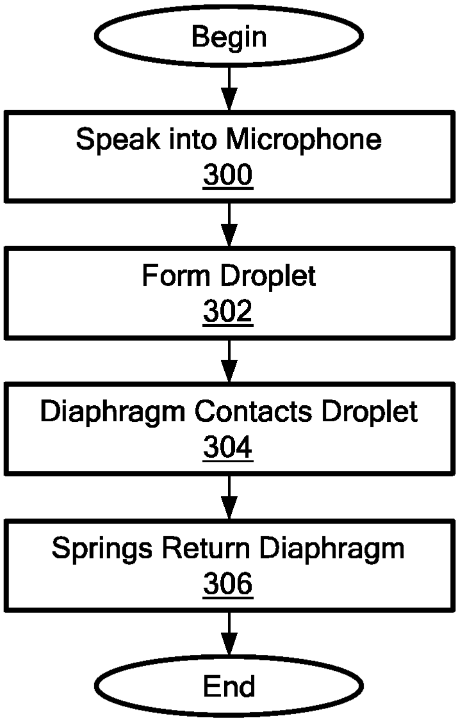
FIG. 3 shows a process describing the microphone during use in accordance with illustrative embodiments of the invention.

FIG. 3 shows a process describing the microphone 10 during use in accordance with illustrative embodiments of the invention. The process begins at step 300, in which a person speaks into the microphone 10. Among other things, the microphone 10 may be a part of a mobile phone or other transducer. It should be noted that discussion of a person speaking is but one of a variety of different uses for the microphone 10. For example, the microphone 10 can receive audio signals from any source, such as a natural source (e.g., a waterfall) or animal.

For any of a number of reasons, a small water-based droplet 22 (also referred to simply as a "water droplet 22" or "droplet 22") may form between the bottom surface of the diaphragm 14 and the top surface of the backplate 12 (step 302). For example, among other ways, the droplet 22 may form moisture from a person's breath, moisture from the general humidity in the environment, or both. As noted above, the water droplet 22 in this example may have an outer dimension that is sized on the order of distance between the diaphragm 14 and the backplate 12. This outer dimension of interest in this case ideally extends along an axis extending straight from the backplate 12 to the diaphragm 14. By way of example, a droplet 22 having an outer dimension of this nature that is greater than or equal to about half the distance between the diaphragm 14 and backplate 12 should be considered to be "on the order of the distance between the diaphragm 14 and the backplate 12."

The process continues to step 304, in which the diaphragm 14 is drawn by the droplet surface tension toward the backplate 12 to contact the droplet 22. Among another ways, an audio signal incident on the diaphragm 14 (either on its top or bottom surface) may cause the diaphragm 14 to vibrate. In illustrative embodiments, the springs 19 primarily control the distance that the diaphragm 14 may move inwardly toward the backplate 12. Other factors, however, may contribute to diaphragm inward movement. For example, the flexibility of the diaphragm 14 may cause it to bend in a manner that causes a portion of it to move closer to the backplate 12 than other portions.

At this stage of the process, the droplet 22 contacts both the diaphragm 14 and backplate 12. The specially configured surface(s) of either or both the diaphragm 14 and backplate 12 nevertheless resist the potential for the droplet 22 to wet their surfaces. Accordingly, the process concludes at step 306 when the springs 19 simply return the diaphragm 14 toward its rest position (i.e., the position of the diaphragm 14 when not subjected to an input audio signal). The trapped gasses within the surface impede wetting and, significantly, stiction.

Accordingly, illustrative embodiments produce a MEMS device, such as the MEMS microphone 10, with specially processed surfaces that reduce stiction between two components that move relative to one another. It should be noted that various embodiments apply to other MEMS devices (e.g., accelerometers, gyroscopes, and pressure sensors). In a corresponding manner, other embodiments are not limited to diaphragms and backplates. For example, illustrative embodiments may be applied to include, among other things, interdigitated fingers of a MEMS comb drive, opposing/facing surfaces of a serpentine spring, a vibrating mass of a gyroscope and adjacent sidewalls, and an accelerometer mass and its underlying substrate.

Although the above discussion discloses various exemplary embodiments of the invention, it should be apparent that those skilled in the art can make various modifications that will achieve some of the advantages of the invention without departing from the true scope of the invention.

What is claimed is:

1. A method comprising:

providing a MEMS microphone with a backplate and a movable diaphragm that together form a variable capacitance, the backplate having a backplate surface, the diaphragm having a diaphragm surface spaced from the backplate surface, at least one of the backplate surface and the diaphragm surface having at least a portion with a Hurst exponent of less than or equal to about 0.5, wherein at least one of the backplate surface and diaphragm surface has a root mean squared roughness that is greater than about 1 nanometer;

producing an audible signal that causes the diaphragm to move relative to the backplate; and forming a water based droplet between the diaphragm surface and the backplate surface.

2. The method as defined by claim 1 wherein when at rest, the diaphragm is spaced a given distance from the backplate, the droplet having a longitudinal dimension extending between the diaphragm and backplate, the longitudinal dimension being greater than half the given distance.

3. The method as defined by claim 1 wherein the diaphragm has a rest position, the method comprising:

urging the diaphragm toward the droplet so that the droplet contacts both the diaphragm and the backplate, the droplet remaining intact; and moving the diaphragm away from the droplet after contacting the droplet, the diaphragm moving to the rest position.

4. The method as defined by claim 3 wherein the MEMS microphone is in a vacuum free environment.

5. The method as defined by claim 3 wherein each of the diaphragm surface and backplate surface has a Hurst exponent that is less than or equal to about 0.5.

6. The method as defined by claim 3 wherein at least one of the diaphragm surface and the backplate surface has a substantially uniform Hurst exponent.

7. The method as defined by claim 1 further comprising treating at least one of the diaphragm surface and backplate surface with carbon nanotube mat, nanowires, or nanoparticles.

8. A MEMS device comprising:

a first surface; and a second surface adjacent to and spaced from the first surface, the first surface being movable relative to the second surface, at least a portion of the first surface being capable of contacting at least a portion of the second surface, at least one of the first and second surfaces having at least a portion with a Hurst exponent that is less than or equal to about 0.5, wherein at least one of the first and second surfaces has a root mean squared roughness that is greater than about 1 nanometer.

9. The MEMS device as defined by claim 8 wherein the first surface is part of a diaphragm and the second surface is part of a backplate.

10. The MEMS device as defined by claim 8 wherein at least one of the first and second surfaces is exposed to the outside environment.

11. The MEMS device as defined by claim 8 wherein at least one of the first and second surfaces has a substantially uniform Hurst exponent.

12. The MEMS device as defined by claim 8 wherein both the first and second surfaces have at least respective portions with Hurst exponents less than or equal to about 0.5.

13. The MEMS device as defined by claim 8 wherein both the first and second surfaces have a Hurst exponent that is less than or equal to about 0.5.

14. The MEMS device as defined by claim 8 wherein the Hurst exponent of the portion of the at least one of the first and second surfaces is between about 0.2 and 0.5.

15. The MEMS device as defined by claim 8 wherein at least one of the first and second surfaces is formed by a treatment with carbon nanotube mat, nanowires, or nanoparticles.

16. A MEMS microphone comprising:

a backplate; and a movable diaphragm forming a variable capacitance with the backplate, the backplate having a backplate surface, the diaphragm having a diaphragm surface, the diaphragm surface facing the backplate surface, at least one of the backplate surface and the diaphragm surface having at least a portion with a Hurst exponent that is less than or equal to about 0.5, wherein at least one of the backplate surface and diaphragm surface has a root mean squared roughness that is greater than about 1 nanometer.

17. The MEMS microphone as defined by claim 16 wherein the entire surface of the at least one of the backplate surface and diaphragm surface has a Hurst exponent that is less than or equal to about 0.5.

18. The MEMS microphone as defined by claim 16 wherein each of the backplate surface and the diaphragm surface has at least a portion with a Hurst exponent that is less than or equal to about 0.5.

19. The MEMS microphone as defined by claim 16 further comprising an organic coating on at least one of the backplate surface and diaphragm surface to reduce surface energy.

20. The MEMS microphone as defined by claim 19 wherein the organic coating is based on one of a fluorocarbon and hydrocarbon.

21. The MEMS microphone as defined by claim 16 wherein the Hurst exponent is substantially uniform across at least one of the backplate surface and diaphragm surface.

22. The MEMS microphone as defined by claim 16 wherein at least one of the diaphragm surface and backplate surface is formed by a treatment with carbon nanotube mat, nanowires, or nanoparticles.

* * * * *